United States Patent
McCune, Jr.

(10) Patent No.: US 7,627,057 B2
(45) Date of Patent: Dec. 1, 2009

(54) QUADRATURE ALIGNMENT IN COMMUNICATIONS RECEIVERS

(75) Inventor: Earl W. McCune, Jr., Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/335,125

(22) Filed: Dec. 15, 2008

(65) Prior Publication Data

US 2009/0129508 A1    May 21, 2009

Related U.S. Application Data

(60) Continuation of application No. 11/503,186, filed on Aug. 14, 2006, now abandoned, which is a division of application No. 09/865,409, filed on May 25, 2001, now Pat. No. 7,116,728.

(51) Int. Cl.
  *H04L 27/00* (2006.01)
(52) U.S. Cl. .................. 375/299; 375/328; 375/316; 375/320
(58) Field of Classification Search .......... 375/299, 375/328, 316, 320
  See application file for complete search history.

(56) References Cited

U.S. PATENT DOCUMENTS

| | | | |
|---|---|---|---|
| 3,185,981 A * | 5/1965 | Bath et al. ............ 342/100 |
| 3,748,572 A | 7/1973 | Kim et al. | |
| 3,769,580 A | 10/1973 | Black | |
| 3,800,228 A | 3/1974 | Acker | |
| 4,475,088 A | 10/1984 | Beard | |
| 4,492,960 A | 1/1985 | Hislop | |
| 4,574,244 A | 3/1986 | Head | |
| 4,652,775 A | 3/1987 | Daudelin | |
| 4,837,457 A * | 6/1989 | Bergstrom et al. ......... 327/482 |
| 4,873,460 A | 10/1989 | Rippel | |
| 5,122,879 A | 6/1992 | Ito | |
| 5,204,561 A | 4/1993 | Richmuller | |
| 5,276,357 A | 1/1994 | Cripe | |
| 5,306,971 A | 4/1994 | McCune | |
| 5,578,917 A | 11/1996 | Bottman | |
| 5,734,683 A | 3/1998 | Hulkko et al. | |
| 5,761,615 A | 6/1998 | Jaffee | |
| 5,835,850 A | 11/1998 | Kumar | |
| 5,898,911 A * | 4/1999 | White ............ 455/232.1 |
| 6,061,551 A | 5/2000 | Sorrells et al. | |
| 6,107,860 A | 8/2000 | Vinciarelli | |
| 6,198,347 B1 | 3/2001 | Sander et al. | |
| 6,208,535 B1 | 3/2001 | Parks | |

(Continued)

*Primary Examiner*—Juan A Torres
(74) *Attorney, Agent, or Firm*—McDermott Will & Emery LLP

(57) ABSTRACT

The present invention, takes advantage of the properties of quadrature signals to achieve precise quadrature alignment in a simple fashion. The expectation of the product of quadrature signals is zero. A phase error detection network therefore operates by multiplying the received quadrature signals and low-pass filtering the product to produce an error signal. When the signals are in precise quadrature relationship, the error signal will be zero. Real-time feedback control may be used to drive the error to zero. In accordance with another aspect of the invention, a variable phase shift network is achieved using a dual delay line. The difference in delay between the two delay lines is adjusted in response to the error signal to obtain precise quadrature alignment. The principles of the invention may be applied in connection with traditional mixer architectures or with switch-mode architectures.

4 Claims, 4 Drawing Sheets

U.S. PATENT DOCUMENTS

| | | |
|---|---|---|
| 6,317,589 B1 | 11/2001 | Nash |
| 6,417,715 B2 | 7/2002 | Hamamoto et al. |
| 6,548,971 B2 | 4/2003 | Gokturk |
| 6,570,416 B1 | 5/2003 | Isurin et al. |
| 6,593,622 B2 | 7/2003 | Kinzer et al. |
| 6,650,169 B2 | 11/2003 | Faye et al. |
| 6,703,762 B1 | 3/2004 | Okada |
| 6,870,405 B2 | 3/2005 | Visser |
| 6,992,520 B1 | 1/2006 | Herbert |
| 7,028,651 B1 | 4/2006 | Merwin |
| 7,170,321 B2 | 1/2007 | Bird et al. |
| 7,256,646 B2 | 8/2007 | Eid et al. |

* cited by examiner

QUADRATURE ALIGNMENT IN COMMUNICATIONS RECEIVERS

RELATED APPLICATIONS

This application is a Continuation of U.S. Ser. No. 11/503,186, filed Aug. 14, 2006 now abandoned, which is a Divisional of U.S. Ser. No. 09/865,409, filed May 25, 2001, now U.S. Pat. No. 7,116,728, the entire contents of each of which are hereby incorporated by reference.

BACKGROUND OF THE INVENTION

1. Field of the Invention

The present invention relates to communications receivers and more particularly to techniques for generating precise quadrature reference signals for use in the same.

2. State of the Art

Direct conversion receivers are known in the art as exemplified by U.S. Pat. No. 6,061,551, incorporated herein by reference. Such receivers have various advantages over conventional superheterodyne receivers. Regardless of the receiver architecture, however, there is typically a need to generate quadrature reference signals, e.g., a pair of local oscillator (LO) signals phased-shifted by 90°. Both analog and digital techniques have been employed for this purpose. In the case of an analog phase-shift network, because the phase-shift network is narrowband, inaccuracies result at frequencies separated from the nominal design frequency. As data rates and constellation complexity increase, these inaccuracies become a significant impairment. In the case of digital techniques, an input signal is required that is a frequency multiple of the desired LO frequency. This input signal is frequency divided, typically multiple times. Because of the high switching speeds involved, such circuitry tends to be fairly power hungry.

U.S. Pat. No. 4,475,088, incorporated herein by reference, describes an alternative architecture for achieving quadrature alignment, i.e., for generating a pair of quadrature signals having a precise 90.degree. phase offset. As illustrated in FIG. 1, a radio frequency (RF) input signal to be detected is coupled to a first input of first and second quadrature detectors, 10 and 12. A local oscillator 14 provides an RF signal which is divided into two reference signals separated from each other by a phase difference of approximately 90.degree. by a variable phase-shift network 16. These signals are coupled to the second inputs of the quadrature detectors 10 and 12. The output signals of the quadrature detectors 10 and 12 are the conventional I and Q signals associated with quadrature detection systems. The I and Q signals appearing at the outputs of the mixers 10 and 12 are coupled to a phase error detection network 18 implemented, for example, by a digital computer suitably programmed or with analog circuitry. As a result of the calculations performed by the phase error detection network 18, a phase error signal is generated which is used to adjust the variable phase shift network 16 to adjust the phase of the reference signals of the quadrature detectors to reduce the phase error. If the I channel output signal is represented as (A sin x) and the Q channel output signal is represented as (B sin y), then the following equation for the phase error results:

$$\phi(\text{error}) = \left[ \frac{A\sin x + B\sin y}{A} - 0.707\frac{B-A}{A} - 1.414 \right]$$

The phase error detection network 18 is based on the foregoing equation. No embodiment of the variable phase shift network is described.

There remains a need for a quadrature alignment technique that is simple in implementation and that achieves precise quadrature alignment.

SUMMARY OF THE INVENTION

The present invention, generally speaking, takes advantage of the properties of quadrature signals to achieve precise quadrature alignment in a simple fashion. In particular, the expectation of the product of quadrature signals is zero. In accordance with the teachings of the invention, a phase error detection network therefore operates by multiplying the received quadrature signals and low-pass filtering the product to produce an error signal. When the signals are in precise quadrature relationship, the error signal will be zero. Real-time feedback control may be used to drive the error to zero. In accordance with another aspect of the invention, a variable phase shift network is achieved using a dual delay line. The difference in delay between the two delay lines is adjusted in response to the error signal to obtain precise quadrature alignment. The principles of the invention may be applied in connection with traditional mixer architectures or with switch-mode (e.g., "aliased undersampling") architectures.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

The present invention takes advantage of the recognition that when I and Q output signals are in quadrature they should be orthogonal, implying the following:

$$E[I(t)Q(t)]=0$$

That is, the expectation (or average value) of the product of I and Q should be zero.

Figure 1:
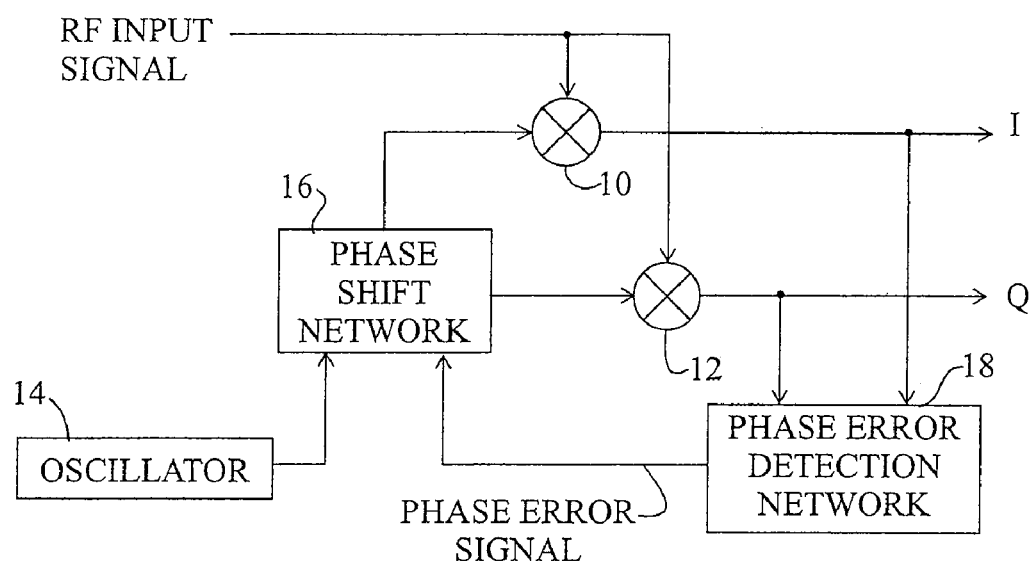
FIG. 1 is a circuit diagram of a known receiver architecture.
Figure 2:
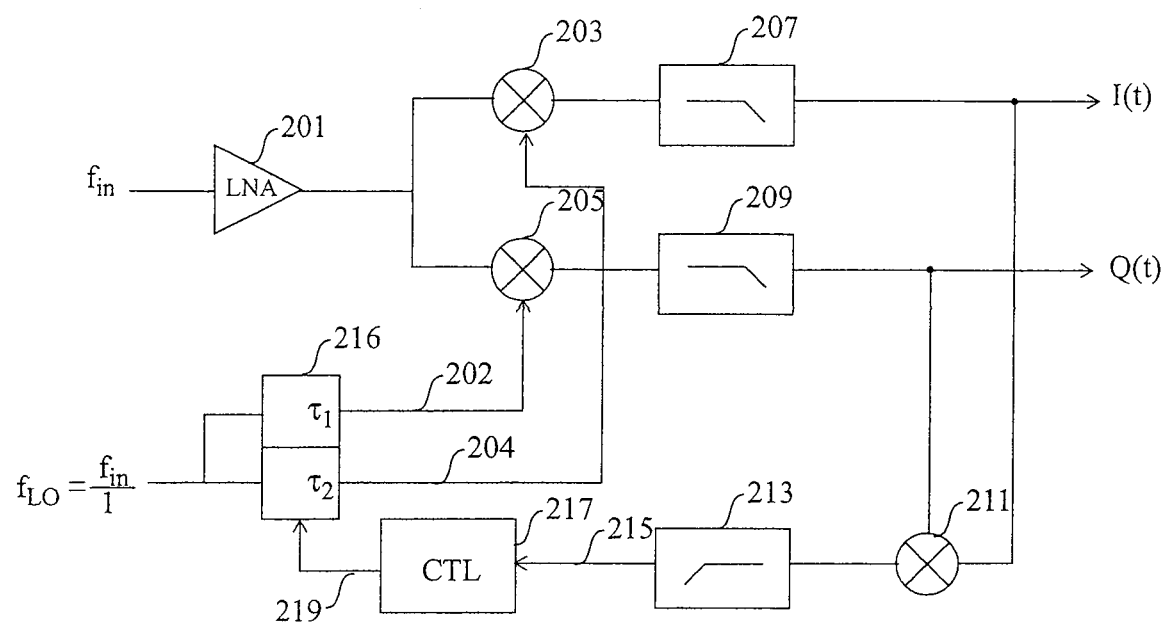
FIG. 2 is a diagram of a receiver in accordance with one embodiment of the invention.

Referring now to FIG. 2, a diagram is shown of a receiver in accordance with one embodiment of the invention. A communications signal having a frequency $f_{in}$ is amplified, e.g. using a low-noise amplifier 201, and is input to respective I and Q mixers 203 and 205. Output signals from the mixers are low-pass filtered using filters 207 and 209 to produce respective I and Q output signals. The received signals I(t) and Q(t) are multiplied using a multiplier 211, and the resulting product is low-pass filtered using a low-pass filter 213 to produce an error signal 215.

Reference signals 202 and 204 for the mixers 203 and 205 are produced using, for example, a dual delay line 216 the delay lines of which exhibit adjustable delays designated as $\tau_1$ and $\tau_2$, respectively. (An example of such a delay line is described in U.S. Pat. No. 5,306,971, incorporated herein by reference.) A local oscillator signal having a frequency designated as $f_{LO}$ is input to both delay lines of the dual delay line. In the illustrated embodiment, because conventional (e.g., Gilbert cell) mixers are used, $f_{LO}=f_{in}$.

The desired quadrature relation exists between the reference signals 202 and 204 when the following relationship is satisfied:

$$\Delta \tau = \tau_1 - \tau_2 = \frac{1}{4f_{in}} = \frac{1}{4f_{LO}} \qquad (1)$$

To cause the foregoing relationship to be satisfied, $\tau_1$ is adjusted or $\tau_2$ is adjusted (or both). This adjustment may be a one-time adjustment performed during manufacture. For example, if the delays are relatively stable over temperature and are fixed to exact quadrature for a mid-band frequency of the input signal receive band, then a typical error of approximately 2° will be experienced at the frequency extremes of the receive band—less than the error of most reactive quadrature networks.

Alternatively, the adjustment may be performed in real time. Referring again to FIG. 2, there is shown a controller 217 that receives the error signal 215 and produces a control signal 219 calculated to drive the error signal to zero, the control signal 219 being applied to the dual delay line 216.

Ideally, when the foregoing equation is satisfied, the error signal will be zero. Note however that, depending on the characteristics of other components in the system, the reference signals may have a phase offset different than 90° in order to obtain precise quadrature alignment of the received signals. This property, that the system is forgiving of potential forward-path impairments, results in increased robustness.

Figure 3:
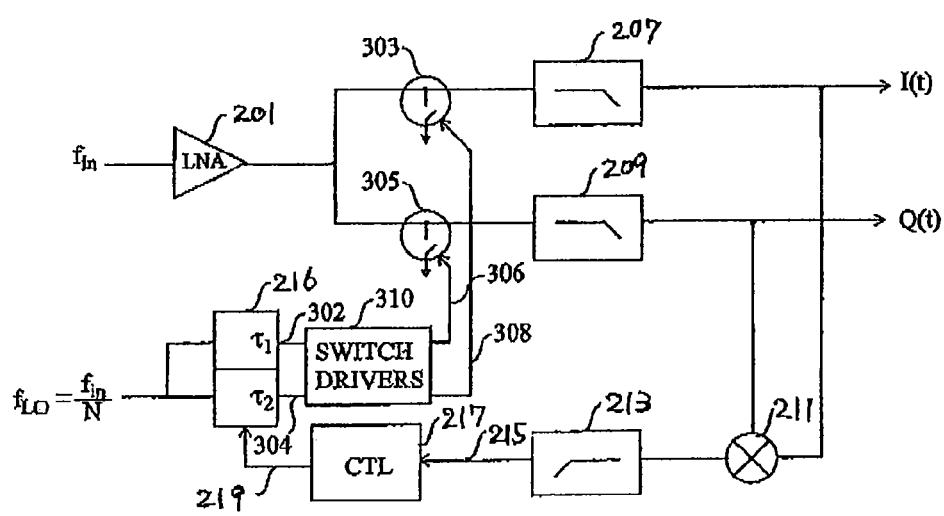
FIG. 3 is a diagram of a receiver in accordance with another embodiment of the invention.

A particularly advantageous arrangement is obtained when the foregoing quadrature alignment technique is applied to a switch-mode receiver architecture as illustrated in FIG. 3. The reference signals 302 and 304, instead of being applied directly to conventional mixers, are applied to switch drivers 310, which produce drive signals 306 and 308 for switches 303 and 305. An alias response of the switches may be used. Hence, in this embodiment, the frequency of the local oscillator may be a sub-harmonic of the frequency of the communications signal to be received; i.e.:

$$f_{LO} = \frac{f_{in}}{N} \qquad (2)$$

where N is an integer greater than one. The time differences of equation (1) hold irrespective of the value of N in equation (2). Thus this technique is general for any mixer implementation. Using switching mixers, however, there results a direct-conversion receiver with no on-frequency local oscillator energy and with unusually high tolerance of blocking signals, i.e., signal of large amplitude in the vicinity of the frequency of interest.

More particularly, because switching mixers are passive, 1/f noise is reduced, and depending on the switch drive waveform, an exceedingly high third-order input intercept point can be achieved. With no LO on-channel leakage, there is also avoided on-channel mixing with such leakage signals among themselves, which in conventional direct-conversion receiver architectures leads to DC offset shifts. Mixer conversion loss may be improved by varying the duty cycle of the switch drive signal.

Blocking tolerance come primarily from the high input second and third order input intercept points of the switching mixer. Further tolerance is gained by having the LO at a very different frequency from that of the signal and nearby blocking signals—as is the case with subharmonic operation. Subharmonic operation avoids the complexity of other methods used to generate on-frequency LO signals from off-frequency oscillators. Voltage controlled oscillator (VCO) pulling by input signal magnitude variations is also eliminated by the same techniques.

Figure 4:
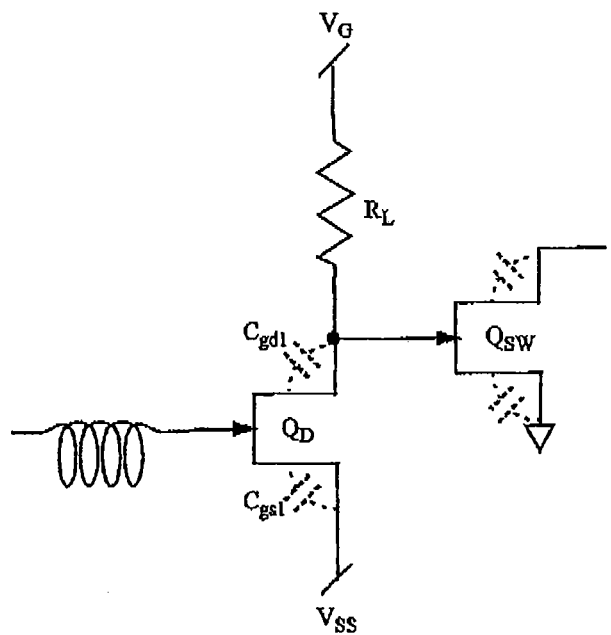
FIG. 4 is a diagram of a switch drive circuit that may be used in the receiver of FIG. 3.
Figure 5:
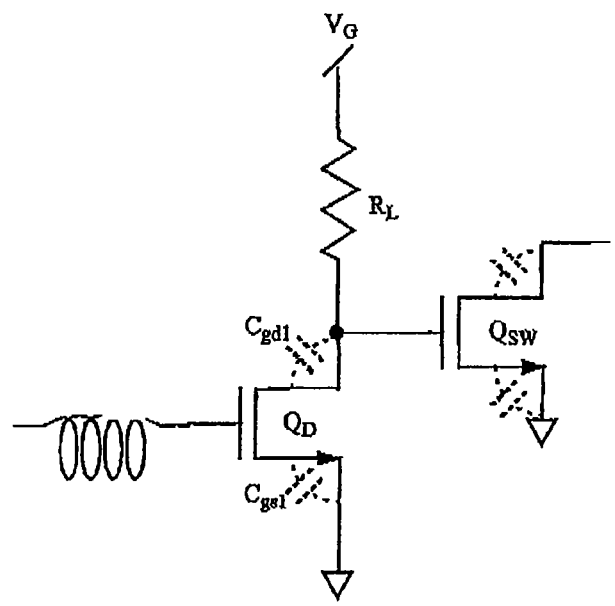
FIG. 5 is a diagram of another switch drive circuit that may be used in the receiver of FIG. 3.

Advantageous switch drive circuits are shown in FIG. 4 and FIG. 5. The principle of these circuits is to drive a power switch with substantially a square wave instead of the usual sine wave. When a sine wave is used, considerable overdrive results, causing forward bias of the gate diode, the inability to resonate the power switch at high frequency, and large leakage of the drive signal into the output signal.

FIG. 4 illustrates a switch drive circuit for a depletion-mode FET such as a MESFET (which has a negative threshold voltage in the vicinity of −3V). A drive transistor $Q_D$ is coupled to drive a switching transistor $Q_{SW}$. The drain of the drive transistor $Q_D$ is coupled to the gate of the switching transistor $Q_{SW}$ and is also coupled through a resistor $R_L$ (i.e., a passive real load) to a voltage $V_G$. The source of the drive transistor is coupled to a voltage $V_{SS}$ more negative than the negative threshold voltage of the switching transistor $Q_{SW}$. The drain of the switching transistor $Q_{SW}$ is coupled (usually through an RF choke) to a supply voltage and to a load device such as an antenna (neither of which are shown).

Because the drive transistor $Q_D$ is much smaller than the switching transistor $Q_{SW}$, the input capacitance $C_{gs1}$ of the drive transistor $Q_D$ can be resonated using a series inductor of practical size. (If, on the other hand, the switching transistor were to be resonated directly, the required inductor would be of such small size as to not be practically realizable.) Furthermore, the input-to-output parasitic coupling capacitance $C_{gd1}$ of the drive transistor $Q_D$ is sufficiently small that overdriving the drive transistor $Q_D$ (using a sine wave) is not a concern.

In operation, as the input of the drive transistor $Q_D$ is resonated, during the positive half-cycle, the drive transistor $Q_D$ is turned on, causing the voltage $V_{SS}$ to be applied to the gate of the switching transistor $Q_{SW}$, abruptly turning it OFF. During the negative half-cycle, the drive transistor $Q_D$ is turned off, causing the voltage $V_G$ to be applied through the resistor $R_L$ to the gate of the switching transistor $Q_{SW}$. The gate voltage rises in accordance with the time constant $\tau = R_L C_{gs2}$, which governs the fall time of the switching transistor $Q_{SW}$, causing the switching transistor $Q_{SW}$ to turn ON.

FIG. 5 illustrates the corresponding circuit for an enhancement-mode FET switch such as an LDMOS transistor. In this instance, when the drive transistor $Q_D$ is turned on, causing the gate of the switching transistor $Q_{SW}$ to be coupled to ground, the switching transistor $Q_{SW}$ is turned off abruptly. The switching transistor $Q_{SW}$ is turned on in accordance with the foregoing time constant when the drive transistor $Q_D$ is turned off, which causes the gate of the switching transistor $Q_{SW}$ to be coupled through the resistor $R_L$ to the voltage $V_G$.

In the case of both circuits, the voltage $V_G$ used to turn on the switching transistor $Q_{SW}$ can be controlled to control drive strength and attendant leakage.

Hence, the foregoing direct drive structure uses a very simple circuit implementation to achieve, simultaneously: minimum rise and fall switching times; minimum drive amplitude and low drive power (improved efficiency) for a desired switch current capability; reduced AM/PM distortion (due to lower feedthrough) and AM/AM distortion (by assuring more "rectangular" signals); and avoidance of gate-source diode forward biasing in MESFETs.

Alternatively, switch drive circuits may be used such as those described in U.S. Pat. No. 6,198,347, incorporated herein by reference.

Although the invention has been described in relation to direct downconversion receiver architectures, the same principles may be applied in conventional heterodyne or super-heterodyne architectures.

Thus, there has been described a quadrature alignment technique for use in communications receivers that is simple in implementation and that achieves precise quadrature alignment. The alignment technique is particularly suitable for direct conversion receiver architectures including switch-mode receiver architectures. The quadrature alignment technique may be used in conjunction with a direct drive structure for power switching transistors to achieve improved efficiency and low distortion.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A receiver for receiving a communications signal to produce two output signals in quadrature relation to one another, comprising:
    a low-noise amplifier;
    a first switching transistor and a second switching transistor being connected to the low-noise amplifier;
    a local oscillator;
    an adjustable phase shift network having a first delay line and a second delay line, each delay line having its input connected to the local oscillator, the first delay line and the second delay line respectively deriving a first reference signal and a second reference signal having a 90° phase difference therebetween;
    means for, using the first and second reference signals, performing frequency downconversion of the communications signal outputted from the low-noise amplifier and outputting the two output signals from the first and second switching transistors; and
    a phase error detection network for forming an error signal derived of the product of the two output signals,
    wherein said adjustable phase shift network adjusts a relative delay between the first reference signal and the second reference signal using the error signal,
    wherein the means for performing frequency downconversion comprises a first drive transistor and a second drive transistor,
    wherein an output of the first delay line is coupled to a gate of the first drive transistor via a first inductor, and a drain of the first drive transistor is coupled to a gate of the first switching transistor,
    wherein an output of the second delay line is coupled to a gate of the second drive transistor via a second inductor, and a drain of the second drive transistor is coupled to a gate of the second switching transistor,
    wherein, each of the drains of the first and second drive transistors is coupled to a first rail voltage which is greater than the threshold voltage of the switching transistor, and each of sources of the drive transistors is coupled to a second rail voltage which is less than the threshold voltage,
    wherein, each of the outputs from the first and second delay lines, supplies a sinusoidal signal to the gate of the respective drive transistor causing, an input capacitance of the respective drive transistor to resonate with an inductance, and causing each drive transistor to alternate between two states including one state in which the drive transistor causes the first rail voltage to be applied to its respective switching transistor through a resistor to turn the switching transistor on, and another state in which each drive transistor causes the second rail voltage to be applied to its respective switching transistor to turn the switching transistor off.

2. The receiver of claim 1, wherein the phase error detection network comprises a multiplier for multiplying the two output signals to form a product signal.

3. The receiver of claim 1, wherein the phase error detection network further comprises a low-pass filter for filtering the product signal to thereby produce the error signal.

4. The receiver of claim 1, wherein the frequency of the local oscillator is a sub-harmonic of a frequency of the communications signal.

* * * * *